United States Patent [19]

Ellis et al.

[11] Patent Number: 4,559,116

[45] Date of Patent: Dec. 17, 1985

[54] PROCESS OF ETCHING SEMICONDUCTOR ELECTRODES

[75] Inventors: Arthur B. Ellis; Michael K. Carpenter, both of Madison, Wis.

[73] Assignee: Minnesota Mining and Manufacturing Company, St. Paul, Minn.

[21] Appl. No.: 628,825

[22] Filed: Jul. 9, 1984

[51] Int. Cl.$^4$ .............................................. C25F 3/12
[52] U.S. Cl. .............................. 204/129.3; 204/129.75
[58] Field of Search ......................... 204/129.3, 129.75

[56] References Cited

U.S. PATENT DOCUMENTS

| | | | |
|---|---|---|---|
| 3,225,253 | 12/1961 | Narken et al. | 315/150 |
| 3,648,052 | 3/1972 | Nakamura et al. | 250/213 |
| 3,783,353 | 1/1974 | Pankove | 317/235 |
| 3,875,473 | 4/1975 | Lebailly | 315/169 |
| 4,364,995 | 12/1982 | Crawford et al. | 428/336 |
| 4,369,099 | 1/1983 | Kohl et al. | 204/129.3 |
| 4,414,066 | 11/1983 | Forrest et al. | 204/129.3 |
| 4,415,414 | 11/1983 | Burton et al. | 204/129.3 |
| 4,482,443 | 11/1984 | Bacon et al. | 204/129.3 |

*Primary Examiner*—Donald R. Valentine
*Attorney, Agent, or Firm*—Donald M. Sell; James A. Smith; Mark A. Litman

[57] ABSTRACT

Semiconductor electrodes whose composition varies with distance from a surface and which varying composition provides different wavelengths of electroluminescence from the different compositions may be spatially and spectrally etched. When the semiconductors are immersed in electrolytic etching solutions, imagewise exposure to electromagnetic radiation will stimulate the etching of the semiconductor when the semiconductor is voltaically connected with an electrode.

19 Claims, No Drawings

PROCESS OF ETCHING SEMICONDUCTOR ELECTRODES

BACKGROUND OF THE INVENTION

1. Field of the Invention

The present invention relates to a process for the photoelectrochemical etching of semiconductor electrodes. A permanent image capable of providing a visible display of differentially electroluminescing semiconductors is provided.

2. Background of the Art

Electroluminescence occurs in semiconductor materials which are capable of emitting visible or near visible radiation when an electrical current passes through the semiconductor. Photoluminescence can also occur in these materials. If external light is used to excite the semiconductor, a characteristic wavelength of light is emitted. These characteristic wavelengths vary amongst different photoluminescent semiconductors and can be varied in a single semiconductor by doping the material. The dopant will ordinarily cause a shift in the wavelength of radiation emitted by the material.

Amongst the various studies on the luminescence of photo-stimulated electroluminescent materials is "Luminescent Photoelectrochemical Cells", Streckert, H. H., Tong, J. and Ellis, A. B., J. Am. Chem. Soc., Vol. 104, No. 2, 1982, pp. 581-588. It is noted therein that the intensity of light emitted by electroluminescence varies directly with the applied voltage. The efficiency of charge transfer and good electrical contact at the surface is also noted as important in the efficiency of the process.

In U.S. patent application Ser. No. 480,471, filed on Mar. 30, 1983 it has been disclosed that a multicolor graded electroluminescent article may be produced. The article must comprise a layer of a first electroluminescent semiconductor, and over only a portion of the surface of said layer is a second electroluminescent semiconductor emitting a characteristic wavelength at least 50 nm different from the characteristic wavelength of the first semiconductor.

The process for manufacturing such graded semiconductor electrodes is disclosed in U.S. patent application Ser. No. 478,476, filed Mar. 24, 1983 now U.S. Pat. No. 4,543,511. One particularly useful process of forming such graded compositions is to diffuse one material (such as sulfur or selenium) into the surface of one photoconductor layer (such as cadmium selenide or cadmium sulfide, respectively). Resistive etching of the graded layers is shown in Ser. No. 480,471.

BRIEF DESCRIPTION OF THE INVENTION

Semiconductor electrodes which vary with respect to both their composition and photoluminescence across their depth may be controllably etched in imagewise fashion by irradiation when immersed in an etchant electrolyte solution. Where the bandgap energy of the composition increases with depth in the semiconductor electrode, the depth of the etching may be controlled completely by selecting radiation with a wavelength intermediate on the electromagnetic spectrum between that of the two surfaces defining the depth over which the composition of the semiconductor varies.

DETAILED DESCRIPTION OF THE INVENTION

Graded semiconductor electrodes in the present invention consist of photoluminescent semiconductors in three dimensional form where one dimension, the depth, is generally relatively small compared to one or both of the other dimensions. The composition of the semiconductor varies across that depth from a first surface to a second surface. The composition across the depth changes gradually from the composition at said first surface to the composition at said second surface. The characteristic photoluminescence of the semiconductor composition also varies with the change in composition across the depth.

Any graded semiconductor electrode having those properties of gradation and variation in spectral photoluminescence across its depth are useful in the practice of the present invention. Of particular interest are the semiconductor electrodes which exhibit variable color emission and are characterized as solid state solutions of three elements, including at least one metal and at least one non-metal element. These elements function in the electrode substrate as a constant element, a substituent element and a displaced element. The concentration of the substituent and the displaced elements, both of which are either metals or non-metals, is varied, preferably monotonically, with depth such that the band gap energy between the valence and conduction bands changes with depth. For emissions in the visible spectrum, assuming band edge emission, the band gap would preferably vary between about 1.7 eV and 3 eV.

Any combination of three metal and non-metal elements that form solid solutions together which satisfy the foregoing band gap energy requirements may be utilized in accordance with the present invention. Examples of such trios of elements are: cadmium, selenium and sulfur; zinc, selenium and sulfur; cadmium, zinc and sulfur; arsenic, gallium and phosphorus; and cadmium, selenium and zinc. To the extent that such elements satisfy the foregoing requirements of forming solid solutions at all levels of substitution and having appropriate band gap energies, any trio of elements may serve as the constant element, the displaced element and the substituent.

Once the graded semiconductor electrode is formed, it is placed into an electrolyte etchant solution. The only critical charcteristic of the solution is that it not chemically attack or modify the semiconductor composition rapidly in the absence of radiation. Rapid attack would occur if the composition were measurably altered or etched in non-irradiated areas in less than one minute at room temperature. Preferably the electrolyte solution would not attack the semiconductor at room temperature in the absence of actinic radiation in less than ten minutes.

It is desirable that the electrolyte solution act as a solvent for the decomposition product of the etching process. If the solution does not act as a solvent for the decomposition product, the process will be greatly retarded. Washing of the surface during etching should be effected as by mechanical agitation of the solution. This kind of washing is undesirably and unnecessarily complicated when the solution of electrolyte is not a solvent for the decomposition product, particularly given the alternative of a solvating etchant solution. Typical etchant solutions would be aqueous solutions of NaCl, NaOH, KCl, NH$_4$Cl and NH$_4$OH. The preferred electrolytes are NaOH and NH4Cl as they are good solvents for many decomposition products of the semiconductor materials and do not attack preferred semiconductor compositions. Non-aqueous solutions based on organic solvents such as toluene, formamide, or methylethylketone could also be used.

The bandgap energy of photoluminescent semiconductors is known to shift with temperature. It is therefore desirable to control the temperature of the operation, particularly where precise etching is required.

The process operates by the energy of the incident radiation being sufficient to promote electrons from the filled to the unfilled states in the semiconductor composition. This enables the electron to become mobile to perform chemical alteration, e.g., ionization, of the semiconductor material enabling it is be dissolved. To enable ready movement of electrons, a voltaic connection to the photoanodic semiconductor is important. The application of an external voltage to the semiconductor (as the anode) will accelerate the etching process.

One particular aspect of the process of the present invention that is of interest is the ability to control the depth of etching by selection of semiconductors having increasing bandgap energies in the composition when going from the surface where the stimulating radiation is incident through its depth. By selecting a stimulating wavelength between the two bandgap energies (at the two surfaces), the etching will stop at that composition where the energy of the wavelength of the stimulating radiation is no longer greater than or equal to the bandgap energy of the composition. As a specific example, where a surface of a cadmium sulfide photoluminescent semiconductor electrode has been treated with selenium so that a graded semiconductor is formed, one surface will emit red (the external cadmium selenide surface) and the other surface will emit green (cadmium sulfide). By using stimulating radiation which is between red and green on the electromagnetic spectrum, the etching will stop when the energy of that radiation is no longer equal to or greater than the bandgap energy of the photoluminescent emission of the exposed semiconductor.

These and other aspects of the present invention will be shown in the following examples.

EXAMPLE 1

As specific illustrative examples of a graded device useful in accordance with the invention, graded cadmium sulfide/cadmium selenide ($CdS_xSe_{1-x}$, $0 \leq X \leq 1$) samples were prepared from 5 by 5 by 1 millimeter, vapor-grown, single-crystal c-plates of n-type cadmium selenide (resistivity approximately 2 ohm-cm; 4-point probe method). A CdSe plate was etched with $Br_2$ in methanol (1:10 V/V) and placed in a 6-millimeter inside diameter, 8-millimeter outside diameter quartz tube with approximately 0.6 milligrams of sulfur, which was free of metallic impurities to better than 10 parts per million (ppm). The quartz ampoule was evacuated (aproximately 1 torr), sealed to a volume of about 2 cubic centimeters and placed in a preheated Lindberg furnace (700° C.) for 15 minutes. After the ampoule was removed from the furnace, one end was contacted by a heat sink to prevent the sulfur from condensing on the crystal substrate. The crystal substrate was then removed and placed in a similar tube with approximately 1 milligram of cadmium having less than 1 ppm of metallic impurities. The tube was evacuated and sealed and again heated at 700° C. for 15 minutes. After its removal from the ampoule, a gallium-indium ohmic contact was formed on one surface of the substrate and a copper wire attached to the contact with silver epoxy. The substrate was then mounted in an electrochemical cell containing an aqueous electrolyte solution of sodium hydroxide and a cathode connection.

An image was focussed on the sulfur rich surface of the semiconductor. The radiation of the image was the same wavelength as the characteristic emission of the cadmium sulfide. The image was focussed on the semiconductor with constant gentle stirring of the solution for more than one hour. Subsequent electroluminescent studies of the semiconductor showed an orange image on a green background.

EXAMPLE 2

A second graded semiconductor was formed according to the process of Example 1 except that a cadmium sulfide conductor was jointly heated with selenium (700° C., 15 minutes) and followed by a heat treatment at 700° C. for 30 minutes with cadmium to produce a surface composition of approximately $CdS_{0.2}Se_{0.8}$ with a graded region of approximately 0.7 micrometers. Two adjacent images were etched in sodium hydroxide solutions, one for 15 minutes with white light and the second for two hours with orange light (Corning 3-66 cut-off filter). Upon electro-luminescent display of the semiconductor, two distinct images were evident on the etched surfaces.

We claim:

1. A process for the etching of graded photoluminescent semiconductors comprising
   A. placing a graded photoluminescent semiconductor in an etchant electrolyte solution that does not readily attack or modify the semiconductor composition,
   B. providing a voltaic connection to said semiconductor, and
   C. exposing at least one surface of said semiconductor to radiation having a wavelength, the energy of which exceeds the bandgap energy of the composition at the surface of said semiconductor thereby causing said surface of said semiconductor to be etched and to expose a semiconductor composition of differing chemical composition than that of the original surface of the semiconductor.

2. The process of claim 1 wherein an external voltage is applied to the semiconductor.

3. The process of claim 2 wherein said electrolyte solution is a solvent for the decomposition product of the semiconductor provided by the etching process.

4. The process of claim 3 wherein the semiconductor composition comprises CdS, CdSe and mixtures thereof.

5. The process of claim 2 wherein said electrolyte solution is a solvent for the decomposition product of the semiconductor provided by the etching process said solution comprising aqueous solutions of compounds selected from the group consisting of NaCl, NaOH, KCl, NH4Cl and NH4OH.

6. The process of claim 2 wherein the semiconductor composition comprises a mixture of CdS and CdSe.

7. The process of claim 1 wherein said electrolyte solution is an aqueous electrolyte solution.

8. The process of claim 7 wherein said electrolyte solution is a solvent for the decomposition product of the semiconductor provided by the etching process.

9. The process of claim 8 wherein the semiconductor composition comprises CdS, CdSe and mixtures thereof.

10. The process of claim 7 wherein the semiconductor composition comprises CdS, CdSe and mixtures thereof.

11. The process of claim 1 wherein said electrolyte solution is a solvent for the decomposition product of the semiconductor provided by the etching process.

12. The process of claim 1 wherein the semiconductor composition comprises CdS, CdSe and mixtures thereof.

13. The process of claim 1 wherein an external voltage is applied to the semiconductor.

14. The process of claim 13 wherein said electrolyte solution is a solvent for the decomposition product of the semiconductor provided by the etching process said solution comprising aqueous solutions of compounds selected from the group consisting of NaCl, NaOH, KCl, NH4Cl and NH4OH.

15. The process of claim 14 wherein the semiconductor composition comprises a mixture of CdS and CdSe.

16. A process for the etching of graded photoluminescent semiconductors comprising
 A. placing a graded photoluminescent semiconductor in an etchant electrolyte solution that does not readily attack or modify the semiconductor composition, said graded semiconductor having increasing bandgap energies going from one surface through its depth,
 B. providing a voltaic connection to said semiconductor, and
 C. exposing said one surface of said semiconductor to radiation having a wavelength, the energy of which exceeds the bandgap energy of the composition at said surface of said semiconductor
thereby causing said one surface of said semiconductor to be etched and to expose a semiconductor composition of differing chemical composition than that of the original surface of the semiconductor.

17. The process of claim 16 wherein said electrolyte solution is a solvent for the decomposition product of the semiconductor provided by the etching process said solution comprising aqueous solutions of compounds selected from the group consisting of NaCl, NaOH, KCl, NH4Cl and NH4OH.

18. The process of claim 16 wherein the semiconductor composition comprises CdS, CdSe and mixtures thereof.

19. The process of claim 16 wherein the semiconductor composition comprises a mixture of CdS and CdSe.

* * * * *